US011177199B2

(12) United States Patent
Kim

(10) Patent No.: US 11,177,199 B2
(45) Date of Patent: Nov. 16, 2021

(54) SEMICONDUCTOR PACKAGES WITH EXTERNAL BUMP PADS HAVING TRENCH PORTIONS AND SEMICONDUCTOR MODULES INCLUDING THE SEMICONDUCTOR PACKAGES

(71) Applicant: Samsung Electronics Co., Ltd., Suwon-si (KR)

(72) Inventor: Gayoung Kim, Cheonan-si (KR)

(73) Assignee: Samsung Electronics Co., Ltd.

( * ) Notice: Subject to any disclaimer, the term of this patent is extended or adjusted under 35 U.S.C. 154(b) by 0 days.

(21) Appl. No.: 16/807,377

(22) Filed: Mar. 3, 2020

(65) Prior Publication Data
US 2021/0028096 A1 Jan. 28, 2021

(30) Foreign Application Priority Data
Jul. 25, 2019 (KR) ........................ 10-2019-0090493

(51) Int. Cl.
*H01L 23/498* (2006.01)
*H01L 23/00* (2006.01)

(52) U.S. Cl.
CPC ........ *H01L 23/49811* (2013.01); *H01L 24/05* (2013.01); *H01L 24/13* (2013.01); *H01L 2224/02333* (2013.01); *H01L 2224/0401* (2013.01); *H01L 2224/0557* (2013.01)

(58) Field of Classification Search
CPC combination set(s) only.
See application file for complete search history.

(56) References Cited

U.S. PATENT DOCUMENTS

| 6,825,541 | B2 | 11/2004 | Huang et al. |
| 8,264,089 | B2 | 9/2012 | Alvarado et al. |
| 8,294,264 | B2 | 10/2012 | Wang et al. |
| 8,916,464 | B2 | 12/2014 | Daubenspeck et al. |
| 9,099,345 | B2 | 8/2015 | Alvarado et al. |
| 9,793,231 | B2 | 10/2017 | Chen et al. |
| 10,147,692 | B2 | 12/2018 | Chen et al. |
| 10,211,141 | B1* | 2/2019 | Fillion .............. H01L 23/49838 |
| 10,510,647 | B2* | 12/2019 | Heo .................. H01L 23/49811 |
| 2008/0101045 | A1* | 5/2008 | Jung ..................... H05K 3/4007 361/761 |
| 2011/0049725 | A1* | 3/2011 | Topacio ................. H01L 24/05 257/773 |
| 2012/0217627 | A1* | 8/2012 | Tseng ..................... H01L 24/03 257/690 |
| 2015/0303159 | A1* | 10/2015 | Lin ......................... H01L 24/11 257/738 |

\* cited by examiner

*Primary Examiner* — Mamadou L Diallo
(74) *Attorney, Agent, or Firm* — Myers Bigel, P.A.

(57) ABSTRACT

A semiconductor package includes a semiconductor chip including a chip pad and an external bump pad electrically connected to the chip pad of the semiconductor chip. The external bump pad may include a trench portion extending from a perimeter surface of the external bump pad toward a center of the external bump pad. The semiconductor package includes an external connector on the external bump pad, with the external connector including a portion that is in the trench portion of the external bump pad.

20 Claims, 14 Drawing Sheets

B1-B1'

B2-B2'

B1-B1'

B2-B2' imes # SEMICONDUCTOR PACKAGES WITH EXTERNAL BUMP PADS HAVING TRENCH PORTIONS AND SEMICONDUCTOR MODULES INCLUDING THE SEMICONDUCTOR PACKAGES

CROSS-REFERENCE TO RELATED APPLICATION

This application claims the benefit of Korean Patent Application No. 10-2019-0090493, filed on Jul. 25, 2019, in the Korean Intellectual Property Office, the disclosure of which is incorporated herein in its entirety by reference.

TECHNICAL FIELD

The present disclosure relates to semiconductor packages and to semiconductor modules including the semiconductor packages.

BACKGROUND

The rapid development of the electronics industry has resulted in electronic equipment that has become increasingly compact and multifunctionalized. Accordingly, the need for compactness and multifunctionalization of semiconductor devices to be used in electronic equipment has correspondingly increased, and the need for semiconductor devices having a fine-pitch connection structure has also increased. However, as the size of a solder ball attached to a fine-pitch connection pad decreases, poor bonding may occur during a solder-ball attach process or the solder ball may be easily damaged by external stress. Therefore, there has been active research into providing reliable electrical connection between a semiconductor device and an external device.

SUMMARY

The present disclosure provides semiconductor packages and semiconductor modules having increased reliability.

Aspects of the inventive concepts disclosed herein are not limited to those mentioned above, and other aspects that have not been mentioned will be clearly understood by one of skill in the art from the description below.

According to some aspects of the inventive concepts, a semiconductor package is provided. The semiconductor package may include a semiconductor chip including a chip pad, an external bump pad electrically connected to the chip pad of the semiconductor chip and including a trench portion extending from a perimeter surface of the external bump pad toward a center of the external bump pad, and an external connector on the external bump pad, the external connector including a portion within the trench portion of the external bump pad.

According to some aspects of the inventive concepts, a semiconductor package is provided. The semiconductor package includes a semiconductor chip including a chip pad; an insulating layer on the semiconductor chip; a redistribution pattern connected to the chip pad of the semiconductor chip and arranged in the insulating layer; an external bump pad; and an external connector. The external bump pad may be connected to the redistribution pattern through an opening of the insulating layer and may include a plurality of trench portions that are spaced apart from each other along an edge of the external bump pad. The external connector may include a portion that contacts the insulating layer through the plurality of trench portions, and the external connector may cover a perimeter surface of the external bump pad.

According to a some aspects of the inventive concepts, a semiconductor module is provided, with the semiconductor module including a module substrate and a semiconductor package on the module substrate. The semiconductor package may include a semiconductor chip including a chip pad, an external bump pad electrically connected to the chip pad of the semiconductor chip and including a plurality of trench portions extending from a perimeter surface of the external bump pad toward a center of the external bump pad, and an external connector between the external bump pad and the module substrate and within the plurality of trench portions of the external bump pad.

BRIEF DESCRIPTION OF THE DRAWINGS

Aspects of the present disclosure will be more clearly understood from the following detailed description taken in conjunction with the accompanying drawings in which.

DETAILED DESCRIPTION

Figure 1:
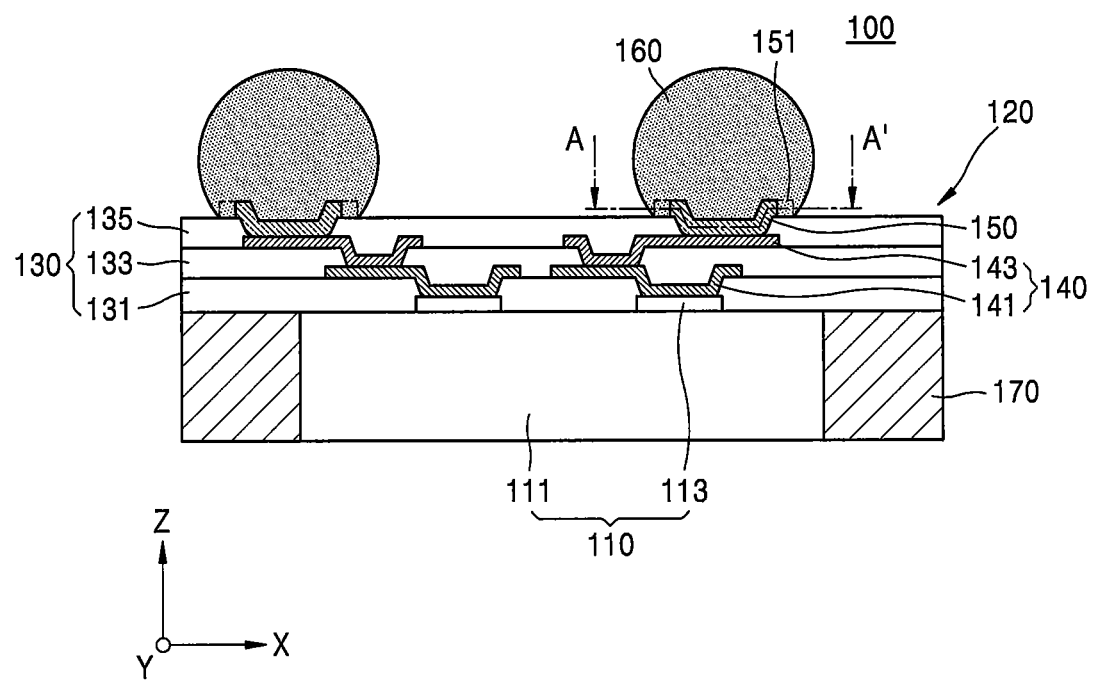
FIG. 1 is a cross-sectional view of a semiconductor package according to some example embodiments.

Hereinafter, some example embodiments will be described with reference to the attached drawings. In the drawings, like numerals denote like elements and redundant descriptions thereof will be omitted.

Figure 2:
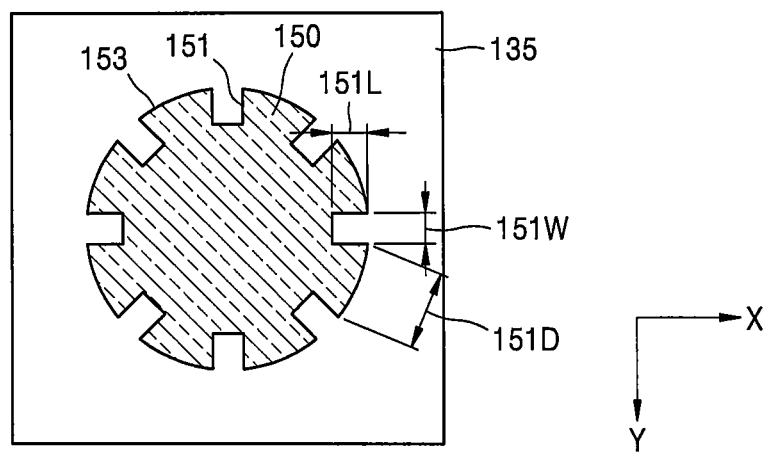
FIGS. 2 and 3 are cross-sectional views taken along line A-A' in FIG. 1.
Figure 3:
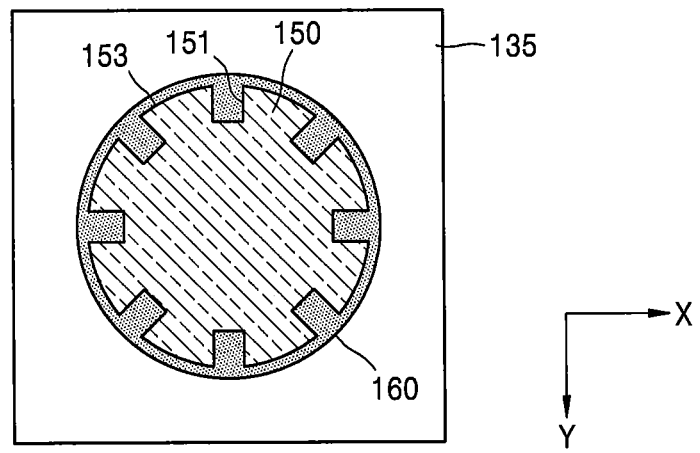

FIG. 1 is a cross-sectional view of a semiconductor package 100 according to some example embodiments. FIGS. 2 and 3 are cross-sectional views taken along line A-A' in FIG. 1. For convenience of description, an external connector 160 is illustrated in FIG. 3 but is omitted from FIG. 2.

Referring to FIGS. 1 through 3, the semiconductor package 100 may include a semiconductor chip 110, a redistribution line structure 120, an external bump pad 150, and the external connector 160.

The semiconductor package 100 may include, for example, a wafer-level package. Although it is illustrated that the semiconductor package 100 has a fan-out structure in FIG. 1, the present disclosure is not limited thereto. For example, the semiconductor package 100 may have a fan-in structure.

The semiconductor chip 110 may include a memory chip or a logic chip. The memory chip may include, for example, a volatile memory chip such as dynamic random access memory (DRAM) or static RAM (SRAM) or a non-volatile memory chip such as phase-change RAM (PRAM), magnetoresistive RAM (MRAM), ferroelectric RAM (FeRAM), or resistive RAM (RRAM). The logic chip may include, for example, a micro processor, an analog device, or a digital signal processor.

The semiconductor chip 110 may include a semiconductor substrate 111, which may have an active side and an inactive side opposite to the active side. The semiconductor substrate 111 may include a silicon wafer including silicon (Si), e.g., crystalline silicon, poly crystalline silicon, or amorphous silicon. Alternatively, the semiconductor substrate 111 may include a semiconductor element, e.g., germanium (Ge), or a compound semiconductor such as silicon carbide (SiC), gallium arsenide (GaAs), indium arsenide (InAs), or indium phosphide (InP). The semiconductor substrate 111 may have a silicon-on-insulator (SOI) structure. For example, the semiconductor substrate 111 may include a buried oxide (BOX) layer. The semiconductor substrate 111 may include a conductive region, e.g., an impurity-doped well or an impurity-doped structure. The semiconductor substrate 111 may have various isolation structures including a shallow trench isolation (STI) structure.

The semiconductor chip 110 may include a semiconductor device formed on the active side of the semiconductor substrate 111. The semiconductor device may include various kinds of individual devices. For example, the individual devices may include various kinds of microelectronic devices, such as a metal-oxide-semiconductor field effect transistor (MOSFET) like a complementary MOS (CMOS) transistor, a system large-scale integration (LSI) device, an image sensor like a CMOS imaging sensor (CIS), a micro-electro-mechanical system (MEMS), an active element, and a passive element.

The semiconductor chip 110 may also include a chip pad 113 on the top surface thereof. The chip pad 113 may be electrically connected to the semiconductor device in the semiconductor chip 110. Although not shown in FIG. 1, the semiconductor chip 110 may include a chip passivation film, which may cover a portion of the chip pad 113 and the top surface of the semiconductor chip 110.

The semiconductor package 100 may include a molding layer 170, which at least partially covers the semiconductor chip 110. The molding layer 170 may include, for example, an epoxy molding compound. The molding layer 170 may not be limited to the epoxy molding compound and may include various materials such as an epoxy material, a thermosetting material, a thermoplastic material, and an ultraviolet (UV) treated material.

The molding layer 170 may cover a side surface of the semiconductor chip 110 and expose a bottom surface of the semiconductor chip 110. Alternatively, the molding layer 170 may also cover the bottom surface of the semiconductor chip 110. When the semiconductor package 100 has a fan-in structure, the molding layer 170 may be omitted.

The redistribution line structure 120 may be arranged on the semiconductor chip 110 and the molding layer 170. The redistribution line structure 120 may include an insulating layer 130 and a redistribution pattern 140.

The insulating layer 130 may include a plurality of insulating layers. For example, the insulating layer 130 may include a first insulating layer 131, a second insulating layer 133, and a third insulating layer 135, which may be sequentially stacked on the semiconductor chip 110.

The first through third insulating layers 131, 133, and 135 may be formed from a material film including an organic polymer material. For example, the first through third insulating layers 131, 133, and 135 may include photosensitive polyimide (PSPI). Alternatively, the first through third insulating layers 131, 133, and 135 may include oxide or nitride. For example, the first through third insulating layers 131, 133, and 135 may include silicon oxide or silicon nitride. The first through third insulating layers 131, 133, and 135 may include the same material as one another, or may include materials different from one another.

The redistribution pattern 140 may extend between the chip pad 113 of the semiconductor chip 110 and the external bump pad 150 and may electrically connect the chip pad 113 of the semiconductor chip 110 to the external bump pad 150. For example, the redistribution pattern 140 may include a first redistribution pattern 141, which is connected to the chip pad 113 of the semiconductor chip 110, and a second redistribution pattern 143, which is connected to the first redistribution pattern 141 and the external bump pad 150.

In detail, a portion of the first redistribution pattern 141 may be directly connected to the chip pad 113 of the semiconductor chip 110 through an opening of the first insulating layer 131, and another portion of the first redistribution pattern 141 may be between the first insulating layer 131 and the second insulating layer 133 and may extend along a top surface of the first insulating layer 131 in a horizontal direction (e.g., an X direction and/or a Y direction). A portion of the second redistribution pattern 143 may be directly connected to the first redistribution pattern 141 through an opening of the second insulating layer 133, and another portion of the second redistribution pattern 143 may be between the second insulating layer 133 and the third insulating layer 135 and may extend along a top surface of the second insulating layer 133 in the horizontal direction (e.g., the X direction and/or the Y direction).

The first redistribution pattern 141 and the second redistribution pattern 143 may include copper (Cu), aluminum (Al), tungsten (W), titanium (Ti), tantalum (Ta), indium (In), molybdenum (Mo), manganese (Mn), cobalt (Co), tin (Sn), nickel (Ni), magnesium (Mg), rhenium (Re), beryllium (Be), gallium (Ga), ruthenium (Ru), or a combination thereof, although the present disclosure is not limited to these examples. The first redistribution pattern 141 and the second redistribution pattern 143 may include the same material as one another, or may include materials different from one another.

The external bump pad 150 may be a pad to which the external connector 160 is attached. The external bump pad 150 may function as under bump metallurgy (UBM). A portion of the external bump pad 150 may be arranged on the third insulating layer 135, and another portion of the external bump pad 150 may be directly connected to the second redistribution pattern 143 through an opening of the third insulating layer 135. The external bump pad 150 may be electrically connected to the chip pad 113 of the semiconductor chip 110 through the redistribution pattern 140. For example, the external bump pad 150 may have a shape with a recessed central portion.

As shown in FIG. 2, in a plan view, the external bump pad 150 may have a circular shape. However, the shape of the external bump pad 150 is not limited thereto. For example, in some embodiments the external bump pad 150 may have a polygonal shape such as a triangle or a quadrangle when viewed in a plan view.

The external bump pad 150 may include chromium (Cr), W, Ti, Cu, Ni, Al, palladium (Pd), gold (Au), or a combination thereof, although the present disclosure is not limited to these examples. The external bump pad 150 may have a single-layer structure or a multilayer structure.

In some example embodiments, a thickness of the external bump pad 150 may be about 9 μm to about 30 μm from the top surface of the insulating layer 130.

As best seen in FIG. 2, the external bump pad 150 may include a trench portion 151 in the edge thereof. The trench portion 151 may extend from a circumferential surface, perimeter surface, or side surface 153 of the external bump pad 150 toward the center of the external bump pad 150.

A plurality of trench portions 151 may be provided in the external bump pad 150. In some example embodiments, the trench portions 151 may be spaced apart from each other by a uniform distance along the edge of the external bump pad 150. At this time, the trench portions 151 may be symmetrically arranged with respect to the center of the external bump pad 150.

In some example embodiments, a distance 151D between adjacent trench portions 151 may be equal to or greater than a width 151W of each of the trench portions 151. For example, the distance 151D between adjacent trench portions 151 may be about one to two times the width 151W of each trench portion 151.

The distance 151D between adjacent trench portions 151 may refer to a distance between a point, at which a side wall of the external bump pad 150 provided by one of the adjacent trench portions 151 meets the side surface 153 of the external bump pad 150, and a point, at which a side wall of the external bump pad 150 provided by the other one of the adjacent trench portions 151 meets the side surface 153 of the external bump pad 150. The width 151W of each trench portion 151 may refer to a distance between two points at which side walls of the external bump pad 150 provided by the trench portion 151 meet the side surface 153 of the external bump pad 150.

In some example embodiments, the width 151W of the trench portion 151 may be about 5 μm to about 10 μm.

In some example embodiments, a length 151L of the trench portion 151 extending from the side surface 153 of the external bump pad 150 toward the center thereof may be about 2% to about 10% of the horizontal width of the external bump pad 150. For example, the length 151L of the trench portion 151 may be about 5 μm to about 20 μm.

The external connector 160 may be arranged on the external bump pad 150. The semiconductor package 100 may be electrically connected to and mounted on a module substrate or a system board of an electronic product through the external connector 160. The semiconductor chip 110 may receive at least one selected from a control signal, a power signal, and a, ground signal for the operation of the semiconductor chip 110 through the external connector 160. The semiconductor chip 110 may also receive a data signal to be stored in the semiconductor chip 110 from outside the semiconductor package 100 through the external connector 160. The semiconductor chip 110 may also provide data stored in the semiconductor chip 110 to outside the semiconductor package 100 through the external connector 160.

The external connector 160 may include a metal material. For example, the external connector 160 may include solder but is not limited thereto. The external connector 160 may have a ball shape, a pillar shape, or a bump shape. For example, the external connector 160 may include a solder ball or a solder bump.

The external connector 160 may at least partially fill the trench portion 151 of the external bump pad 150. The external connector 160 may at least partially fill the trench portion 151 of the external bump pad 150 and be in contact with the top surface of the insulating layer 130, which may be exposed through the trench portion 151. The external connector 160 may entirely or partially fill the trench portion 151 of the external bump pad 150. The external connector 160 may be in contact with the inner wall of the external bump pad 150, which is provided by the trench portion 151 of the external bump pad 150.

In addition, the external connector 160 may at least partially cover the side surface 153 of the external bump pad 150. In some embodiments, the external connector 160 may entirely cover the side surface 153 of the external bump pad 150.

To form the external connector 160, a solder ball may be arranged on the external bump pad 150 and a reflow process may be performed. During the reflow process, the trench portion 151 of the external bump pad 150 may induce side wetting of a solder material. In detail, during the reflow process, a melted solder material may flow into and fill the trench portion 151 of the external bump pad 150. The melted solder material that has flowed into the trench portion 151 of the external bump pad 150 may flow over the edge of the external bump pad 150 and cover the side surface 153 of the external bump pad 150.

According to some example embodiments, the external connector 160 is in contact with the inner wall of the external bump pad 150, which is provided by the trench portion 151 of the external bump pad 150, and the side surface 153 of the external bump pad 150. Therefore, a contact area between the external connector 160 and the external bump pad 150 may increase. Accordingly, a contact resistance between the external connector 160 and the external bump pad 150 may decrease. As a result, the electrical characteristics of the semiconductor package 100 may increase.

Figure 4:
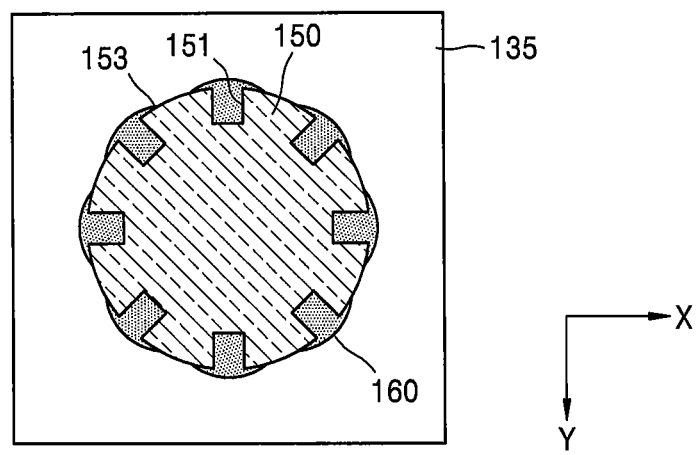
FIGS. 4 through 6 are diagrams of a portion of a semiconductor package, according to some example embodiments.
Figure 5:
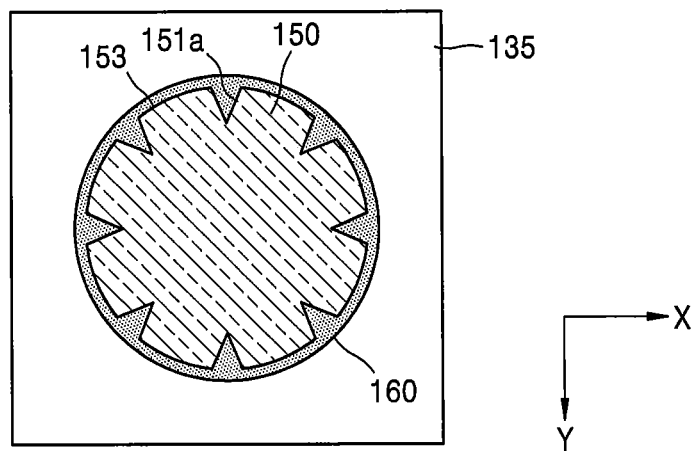
Figure 6:
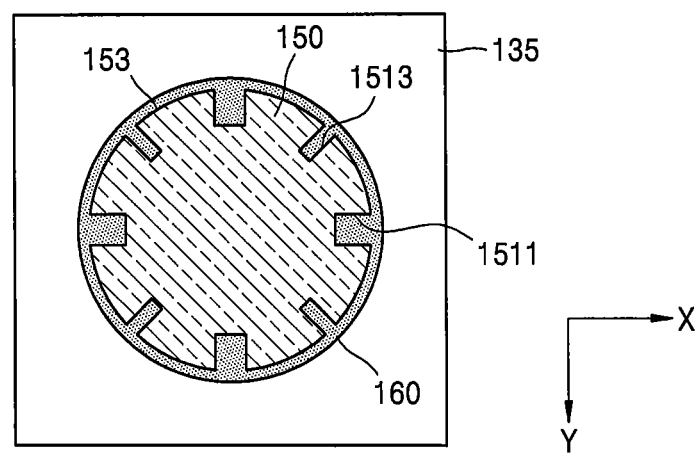

FIGS. 4 through 6 are diagrams of a portion of a semiconductor package, according to some example embodiments.

FIGS. 4 through 6 are cross-sectional views of a portion corresponding to line A-A' in FIG. 1. For convenience of description, descriptions below will be focused on differences from the semiconductor package 100 described above with reference to FIGS. 1 through 3.

Referring to FIG. 4, in some example embodiments, the external connector 160 may partially cover the side surface 153 of the external bump pad 150. In other words, the external connector 160 may cover a portion of the side surface 153 of the external bump pad 150 adjacent to the trench portion 151, while other portions of the side surface 153 of the external bump pad 150 may be free from the external connector 160. The other portions of the side surface 153 of the external bump pad 150 may not be covered by the external connector 160 and may be exposed outwards.

Referring to FIG. 5, in some example embodiments, when viewed in a plan view, a trench portion 151a of the external bump pad 150 may have a shape narrowing from the side surface 153 of the external bump pad 150 toward the center of the external bump pad 150. In other words, the width of the trench portion 151a of the external bump pad 150 may decrease as a distance from the side surface 153 of the external bump pad 150 increases, and/or may decrease as a distance from the center of the external bump pad 150 decreases.

In some example embodiments, the trench portion 151a of the external bump pad 150 may have a shape that narrows from the side surface 153 of the external bump pad 150 toward the center of the external bump pad 150, and the shape may have a pointed end.

In some example embodiments, the trench portion 151a of the external bump pad 150 may have a shape that narrows from the side surface 153 of the external bump pad 150 toward the center of the external bump pad 150 and have a rounded end.

Referring to FIG. 6, in some example embodiments, a plurality of trench portions in the external bump pad 150 may have at least first trench portions and second trench portions with widths that differ from each other.

In some example embodiments, the trench portions may include a first trench portion 1511 having a first width and a second trench portion 1513 having a second width. In some example embodiments, the first width of the first trench portion 1511 may be greater than the second width of the second trench portion 1513.

A plurality of the first trench portions 1511 may be symmetrically arranged with respect to the center of the external bump pad 150 and a plurality of the second trench portions 1513 may be symmetrically arranged with respect to the center of the external bump pad 150. In some example embodiments, the first trench portions 1511 may alternate with the second trench portions 1513 along the edge of the external bump pad 150. In other words, one second trench portion 1513 may be arranged between two adjacent first trench portions 1511.

Figure 7:
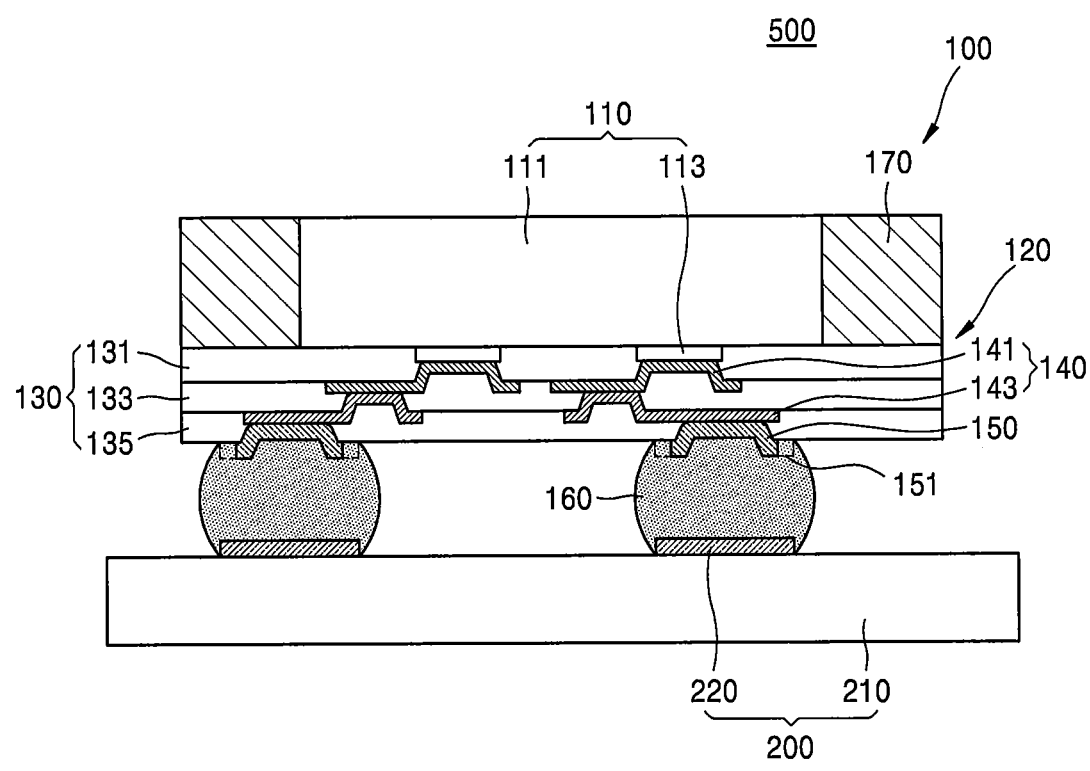
FIG. 7 is a cross-sectional view of a semiconductor module according to some example embodiments.

FIG. 7 is a cross-sectional view of a semiconductor module 500 according to some example embodiments.

Referring to FIG. 7, the semiconductor module 500 may include a module substrate 200 and the semiconductor package 100 mounted on the module substrate 200.

The module substrate 200 may include a body portion 210 and a wiring 220. A portion of the wiring 220 may function as a substrate pad to which the external connector 160 is mounted.

For example, the module substrate 200 may include a printed circuit board (PCB). When the module substrate 200 includes a PCB, the body portion 210 of the module substrate 200 may be usually formed thin by compressing a polymer material like thermosetting resin, epoxy resin such as flame retardant 4 (FR-4), bismaleimide triazine (BT), or Ajinomoto build-up film (ABF), or phenol resin. The polymer material may be compressed into a certain thickness, and the wiring 220, which is a transmission path of an electrical signal, may be formed by disposing a copper foil on the surface of the body portion 210 and performing patterning. Although not shown, a protective layer may be formed by applying solder resist to the top and bottom surfaces of the body portion 210.

Although FIG. 7 illustrates that the module substrate 200 includes a single-layer PCB having the wiring 220 on one side of the module substrate 200, the module substrate 200 may include a double-layer PCB having the wiring 220 on each of both sides thereof. The module substrate 200 is not limited to the PCB structures or materials described above.

The semiconductor package 100 may be mounted on the top surface of the module substrate 200. The external connector 160 may be between the wiring 220 on the top surface of the module substrate 200 and the external bump pad 150. The external connector 160 may be in contact with the wiring 220 of the module substrate 200 and the external bump pad 150 and may thus electrically connect the wiring 220 of the module substrate 200 to the external bump pad 150.

Figure 8:
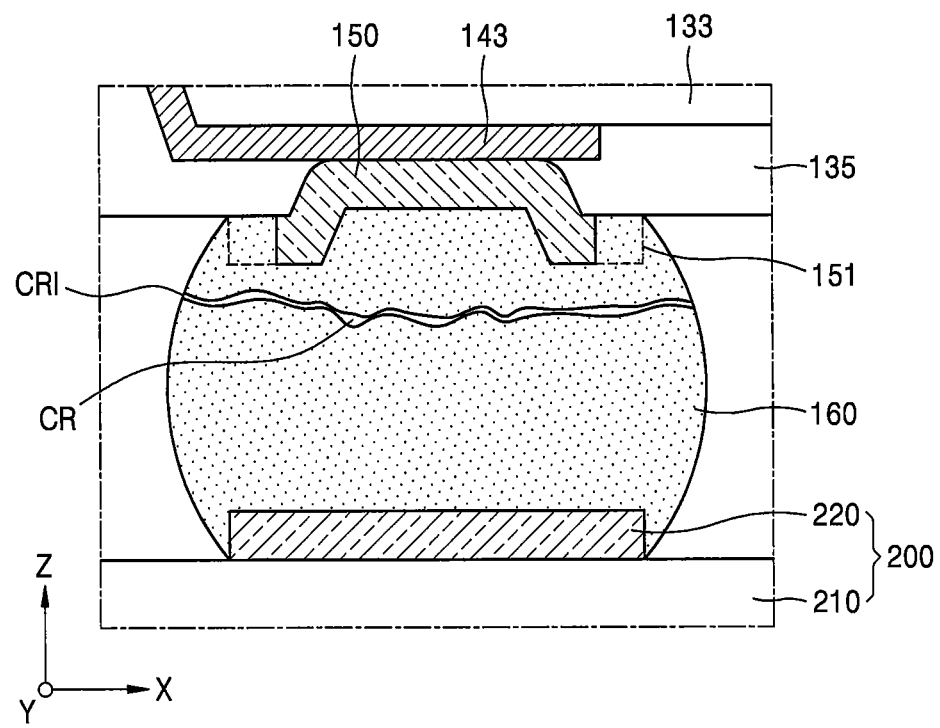
FIG. 8 is an enlarged view of a portion of the semiconductor module of FIG. 7.

FIG. 8 is an enlarged view of a portion of the semiconductor module 500 of FIG. 7. FIG. 8 schematically shows a state where a crack CR is formed in the external connector 160.

Referring to FIG. 8, the crack CR may be formed in the external connector 160 between the external bump pad 150 and the module substrate 200 due to external stress. Usually, the crack CR starts from a point, which is adjacent to the side surface of the external bump pad 150 in the external connector 160, and propagates along the border between the external connector 160 and the external bump pad 150. At this time, when the crack CR has propagated from one end to the other of the external connector 160, the external connector 160 is completely fractured.

However, according to some example embodiments, the external connector 160 relatively thickly covers the side surface 153 (in FIG. 3) of the external bump pad 150, and accordingly, the crack CR may start from a point that is separated from the top end of the side surface 153 of the external bump pad 150 toward the body portion 210. In other words, a start point CRI of the crack CR may be located farther from the external bump pad 150 than a start point of a crack occurring in an external connector of general semiconductor modules. In this case, a total length of the propagation path of the crack CR till the complete fracture of the external connector 160 increases, and accordingly, the life of the external connector 160 may increase. The joint reliability between the semiconductor package 100 and the module substrate 200 may increase, and board level reliability may also increase.

FIGS. 9 through 14B are diagrams showing a method of manufacturing a semiconductor package, according to some example embodiments. Hereinafter, a method of manufacturing the semiconductor package 100 illustrated in FIGS. 1 through 3 will be described with reference to FIGS. 9 through 14B.

Figure 9:
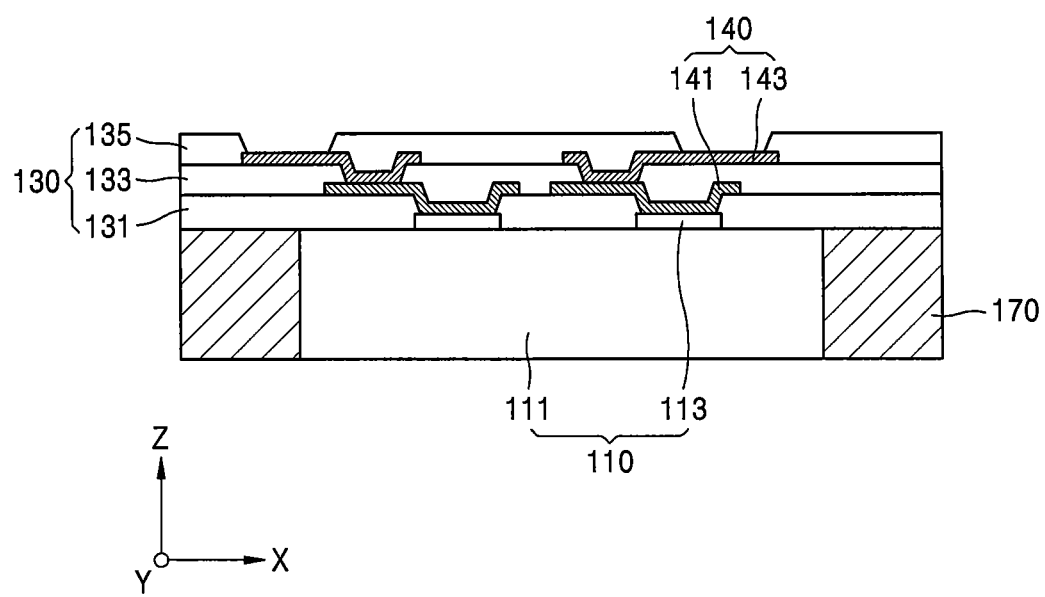
FIGS. 9 through 14B are diagrams showing a method of manufacturing a semiconductor package, according to some example embodiments.

FIG. 9 schematically shows the cross-section of the main configuration of the semiconductor package 100. FIGS. 10A, 11A, 12A, 13A, and 14A schematically show the main configurations of the semiconductor package 100, which correspond to a cross-section along line A-A' in FIG. 1. FIG. 10B shows a cross-section taken along line B1-B1' in FIG. 10A and a cross-section taken along line B2-B2' in FIG. 10A. FIGS. 11B, 12B, 13B, and 14B show portions corresponding to the cross-section taken along line B1-B1' in FIG. 10A and portions corresponding to the cross-section taken along line B2-B2' in FIG. 10A.

Referring to FIG. 9, the semiconductor chip 110 is prepared and the molding layer 170 is formed to partially surround the semiconductor chip 110. The molding layer 170 may be formed to cover the side surface of the semiconductor chip 110.

After the molding layer 170 is formed, the first insulating layer 131 is formed on the semiconductor chip 110. To form the first insulating layer 131, an insulating film may be formed to cover a side of the semiconductor chip 110 and a side of molding layer 170 and then partially removed to form an opening exposing the chip pad 113 of the semiconductor chip 110.

After the first insulating layer 131 is formed, the first redistribution pattern 141 is formed on the first insulating layer 131. The first redistribution pattern 141 may be formed on the top surface of the first insulating layer 131 and on the top surface of the chip pad 113 of the semiconductor chip 110, which is exposed through the opening of the first insulating layer 131. The first redistribution pattern 141 may be formed using, for example, a seed layer forming process, a mask process, and/or a plating process, but the present disclosure is not limited thereto.

After the first redistribution pattern 141 is formed, the second insulating layer 133, the second redistribution pattern 143, and the third insulating layer 135 are sequentially formed. The second insulating layer 133 and the third insulating layer 135 may be formed using a method that is substantially the same or similar to the method for forming the first insulating layer 131. The second redistribution pattern 143 may be formed using a method that is substantially the same or similar to the method for forming the first redistribution pattern 141.

Figure 10A:
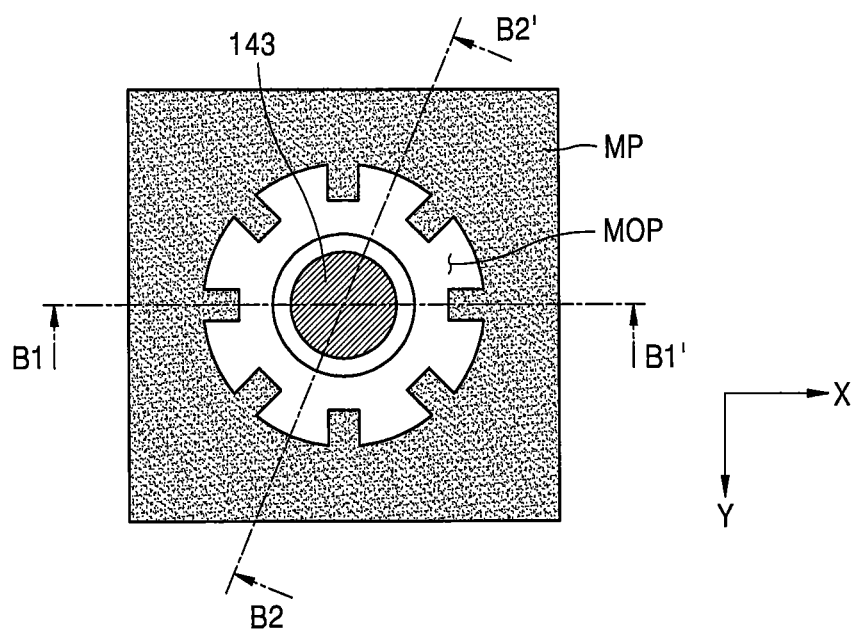
Figure 10B:
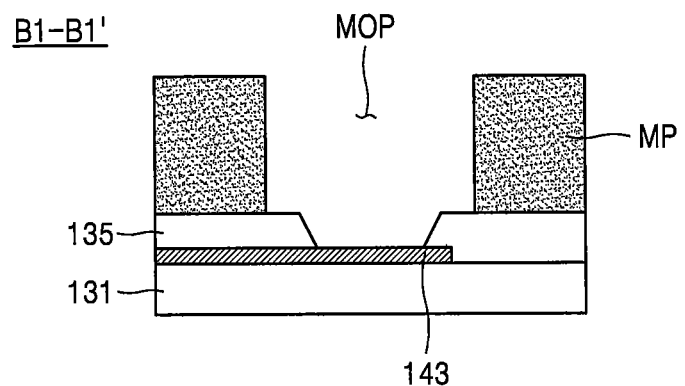
Figure 10B:
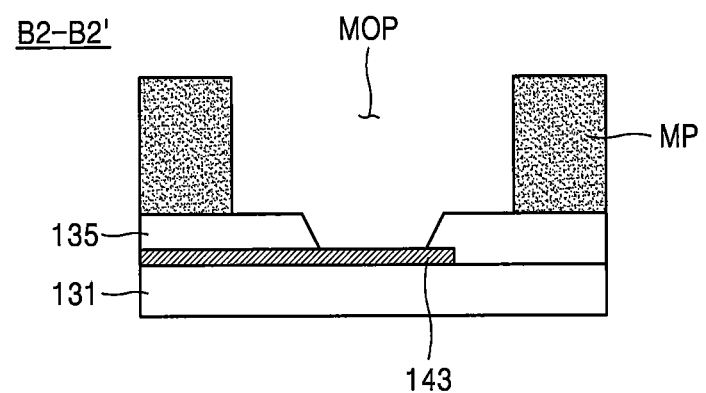

Referring to FIGS. 10A and 10B, a mask pattern MP is formed on the third insulating layer 135. For example, a photosensitive material film may be applied to the third insulating layer 135 and then patterned by performing exposure and development on the photosensitive material film. As a result of patterning the photosensitive material film, the mask pattern MP including a mask opening MOP may be formed. The mask opening MOP of the mask pattern MP may define a region in which the external bump pad 150 (in FIG. 11A) will be formed using a subsequent process.

Figure 11A:
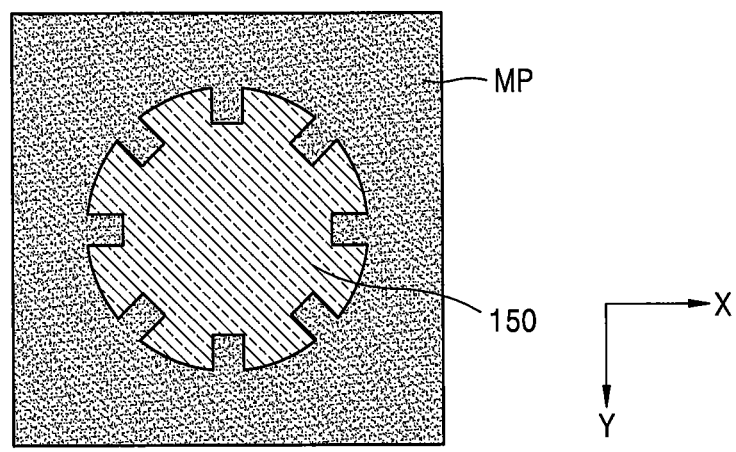
Figure 11B:
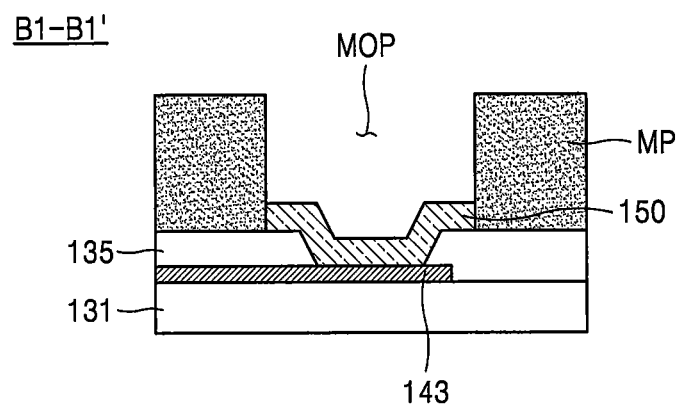
Figure 11B:
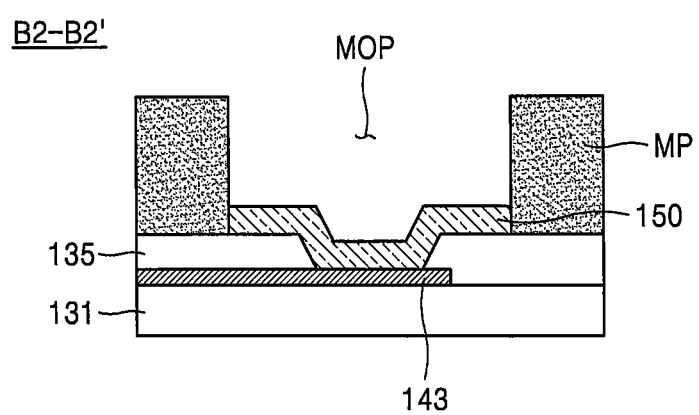

Referring to FIGS. 11A and 11B, after the mask pattern MP is formed, the external bump pad 150 is formed in the mask opening MOP of the mask pattern MP. The external bump pad 150 may be directly connected to the second redistribution pattern 143 through an opening of the third insulating layer 135. The external bump pad 150 may be formed using, for example, a plating process, but the present disclosure is not limited thereto.

Figure 12A:
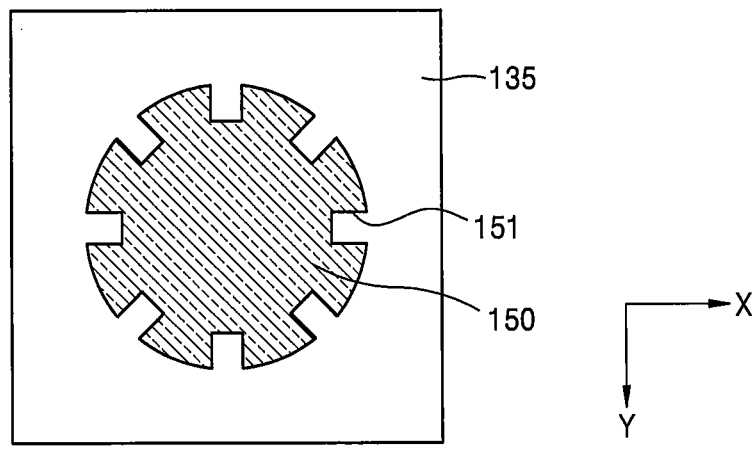
Figure 12B:
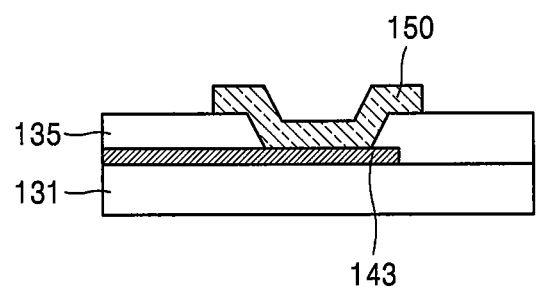
Figure 12B:
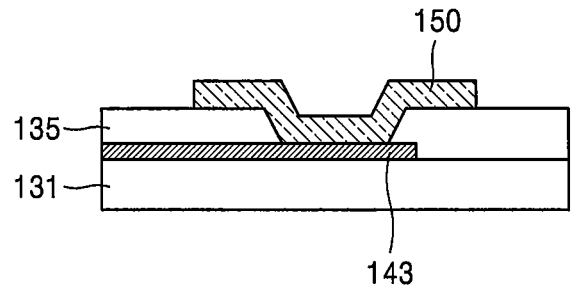

Referring to FIGS. 11A, 12A, and 12B, after the external bump pad 150 is formed, the mask pattern MP is removed. As a result of removing the mask pattern MP, the external bump pad 150 including a trench portion 151 may be formed. For example, to remove the mask pattern MP, a strip process and/or an ashing process may be performed.

Figure 13A:
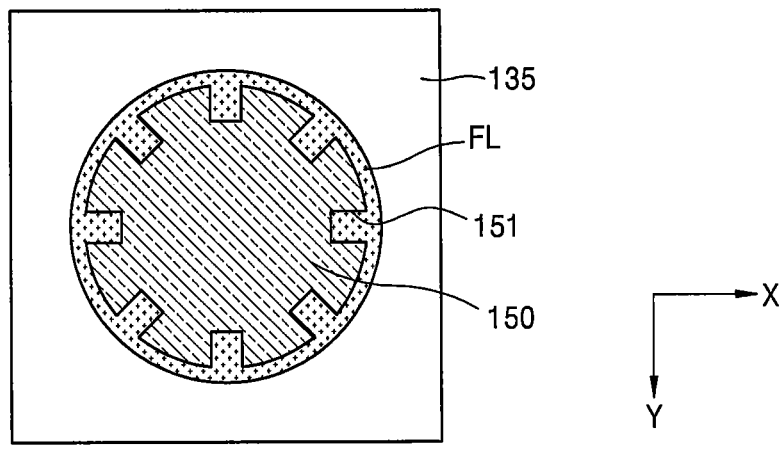
Figure 13B:
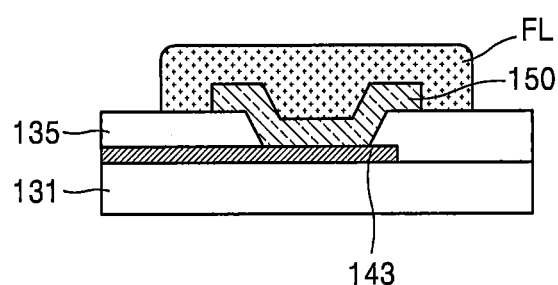
Figure 13B:
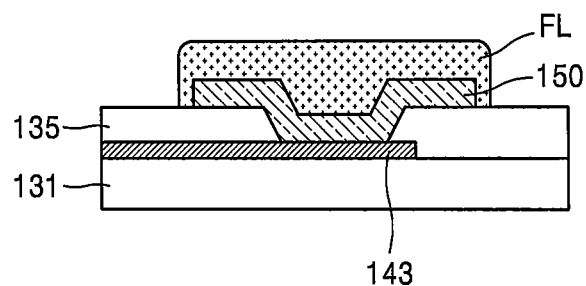

Referring to FIGS. 13A and 13B, flux FL is formed on the external bump pad 150. The flux FL may be applied to cover the surface of the external bump pad 150 and fill the trench portion 151 of the external bump pad 150. The flux FL may prevent an oxide film from being formed on the surface of a solder material of the external connector 160 (in FIG. 14A) or the surface of the external bump pad 150 during a reflow process and may increase wettability of the solder material with respect to the external bump pad 150.

Figure 14A:
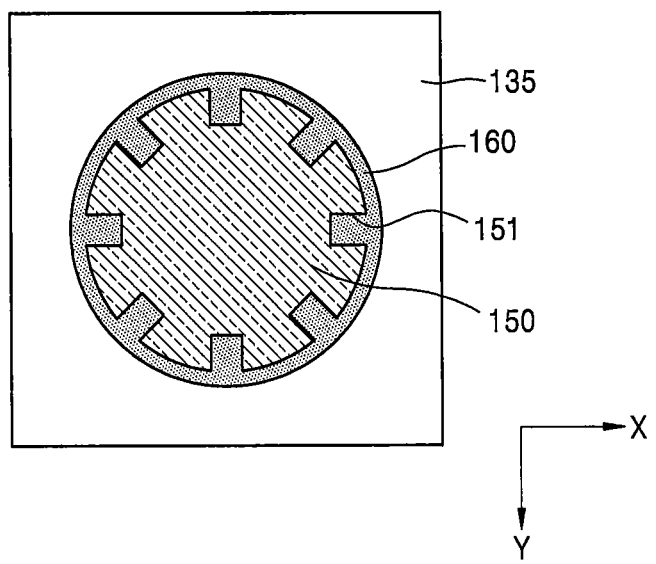
Figure 14B:
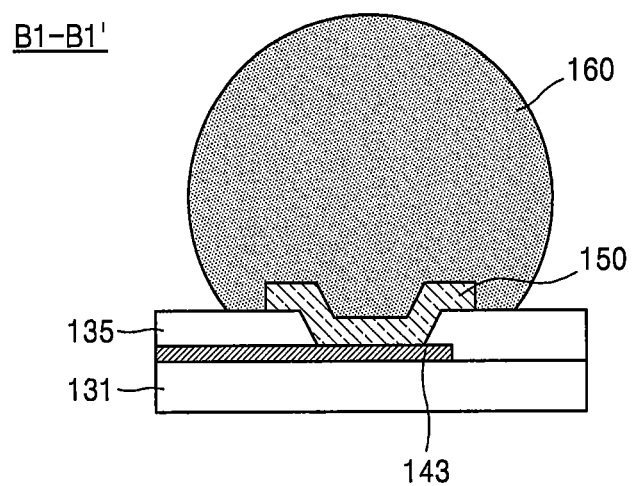
Figure 14B:
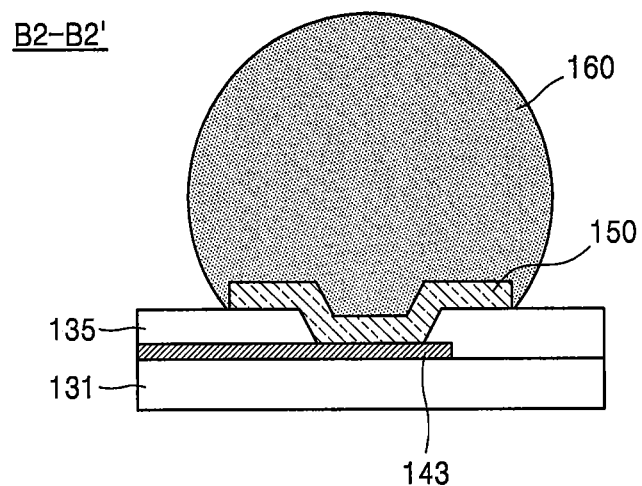

Referring to FIGS. 14A and 14B, a solder material (e.g., a solder ball) is arranged on the external bump pad 150 and a reflow process is performed to form the external connector 160. Through the reflow process, the solder material is melted at high temperature and then hardened into the external connector 160. After the reflow process, residue of the flux FL (in FIG. 13A) may be removed using a cleaning process.

During the reflow process, the solder material is melted into liquid at high temperature and thus fills the trench portion 151 of the external bump pad 150. In addition, the melted solder material that has flowed into the trench portion 151 of the external bump pad 150 may flow over the edge of the external bump pad 150. The flux FL (in FIG. 13A) that has filled the trench portion 151 of the external bump pad 150 may help the solder material flow over the edge through the trench portion 151 during the reflow process. The solder material that has flowed over the edge of the external bump pad 150 through the trench portion 151 may cover the side surface 153 of the external bump pad 150.

After the external connector 160 is formed, a singulation process may be performed on a resultant structure of FIGS. 14A and 14B such that the semiconductor package 100, which has been individualized as shown in FIG. 1, may be completely formed.

According to some example embodiments, during a reflow process, a melted solder material may spread out of the external bump pad 150 through the trench portion 151 of the external bump pad 150, and accordingly, the external connector 160 may be formed to fill the trench portion 151 of the external bump pad 150 and cover a side surface of the external bump pad 150.

Therefore, a contact area between the external connector 160 and the external bump pad 150 may increase, and accordingly, the electrical characteristics of the semiconductor package 100 may be enhanced. In addition, the external connector 160 relatively thickly covers the side surface of the external bump pad 150, and accordingly, a total length of the propagation path of a crack till the complete fracture of the external connector 160 may increase. Accordingly, the life of the external connector 160 may increase, and eventually the joint reliability between the semiconductor package 100 and the module substrate 200 may increase.

Figure 15A:
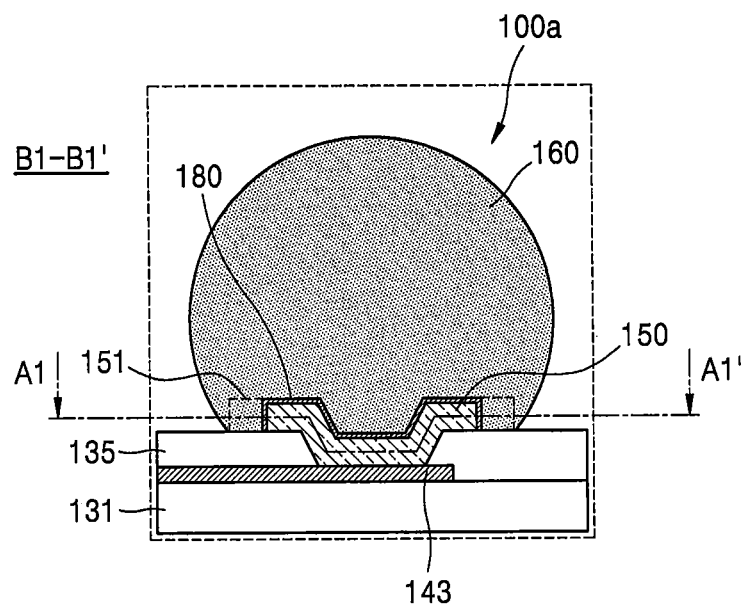
FIGS. 15A and 15B are diagrams of a portion of a semiconductor package, according to some example embodiments.
Figure 15B:
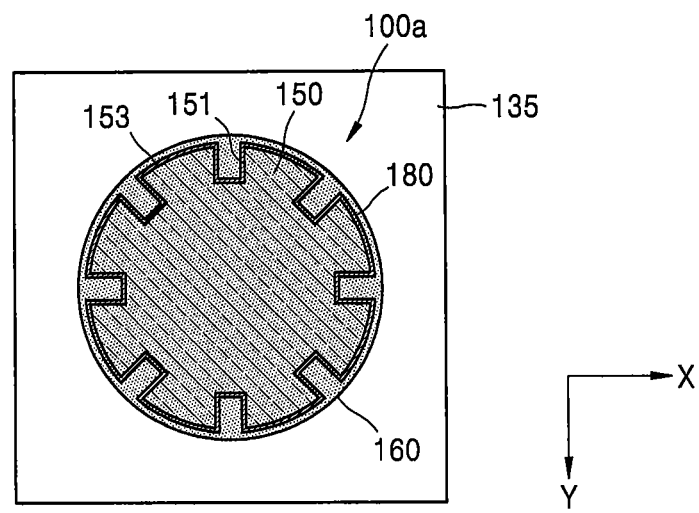

FIGS. 15A and 15B are diagrams of a portion of a semiconductor package 100a, according to some example embodiments.

FIG. 15A is a cross-sectional view of the portion of the semiconductor package 100a, according to some example embodiments. FIG. 15B is a cross-sectional view taken along line A1-A1' in FIG. 15A. For convenience of description, descriptions below will be focused on differences from the semiconductor package 100 described above with reference to FIGS. 1 through 3.

Referring to FIGS. 15A and 15B, the semiconductor package 100a may include a cover metal layer 180, which may be arranged between the external bump pad 150 and the external connector 160 to at least partially cover the external bump pad 150.

In some example embodiments, the cover metal layer 180 may entirely cover the surface of the external bump pad 150. For example, the cover metal layer 180 may cover the top and side surfaces of the external bump pad 150 and the inner wall of the external bump pad 150, which is provided by the trench portion 151. In some example embodiments, the cover metal layer 180 may partially cover the surface of the external bump pad 150. For example, the cover metal layer 180 may be formed only on the top surface of the external bump pad 150.

The cover metal layer 180 may include a material, which may increase the wettability of a melted solder material of the external connector 160 during a reflow process. In some example embodiments, the cover metal layer 180 may include Au, Pd, Ni, Cu, or a combination thereof. For example, when the external bump pad 150 includes Cu, the cover metal layer 180 may include Au.

The cover metal layer 180 may be formed using a plating method. For example, the cover metal layer 180 may be formed to at least partially cover the external bump pad 150 by performing a plating process on a resultant structure of FIGS. 12A and 12B. When the reflow process is performed as described above with reference to FIGS. 14A and 14B, the cover metal layer 18Q includes a material that may increase the wettability of a solder material, thereby more enhancing the spread of the solder material.

Figure 16:
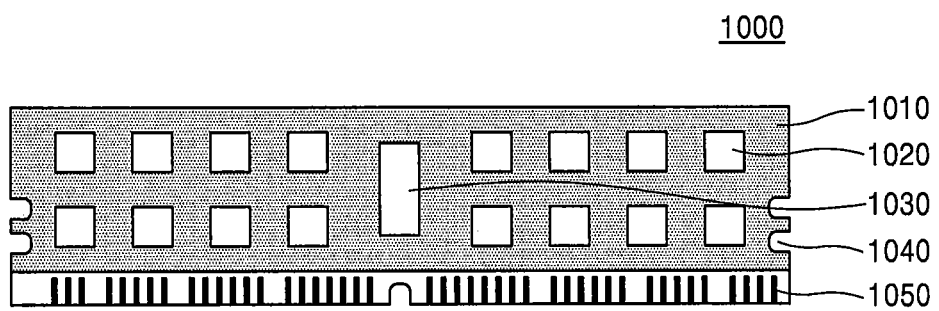
FIG. 16 is a plan view of a semiconductor module according to some example embodiments.

FIG. 16 is a plan view of a semiconductor module 1000 according to some example embodiments.

Referring to FIG. 16, the semiconductor module 1000 may include a module substrate 1010; a plurality of semiconductor packages 1020 and a controller chip 1030, which are mounted on the module substrate 1010; and an indentation structure 1040 and a port 1050, which may arranged along one or more edges of the module substrate 1010.

As a support substrate on which the semiconductor packages 1020 and the controller chip 1030 are mounted, the module substrate 1010 may include a PCB having a certain form factor. The form factor may define the thickness, length, and width of the module substrate 1010.

The plurality of semiconductor packages 1020 may include, for example, the semiconductor package 100 described with reference to FIGS. 1 through 6 and the semiconductor package 100*a* described with reference to FIGS. 15A and 15B. The plurality of semiconductor packages 1020 may be electrically connected to the port 1050 through wiring (not shown) included in the module substrate 1010.

The controller chip 1030 may control the plurality of semiconductor packages 1020. For example, the controller chip 1030 may read data from the plurality of semiconductor packages 1020 or program new data to the plurality of semiconductor packages 1020 according to a command of an external host.

At least one indentation structure 1040 may be included in the semiconductor module 1000 such that the module substrate 1010 is configured to be mounted on and fixed to a main board or a system board.

The port 1050 may include a plurality of pins, and the number, size, and arrangement of pins may be determined based on an interface protocol used to communicate with an external host (not shown). The pins may be configured to connect to a socket included in a main board or a system board.

Figure 17:
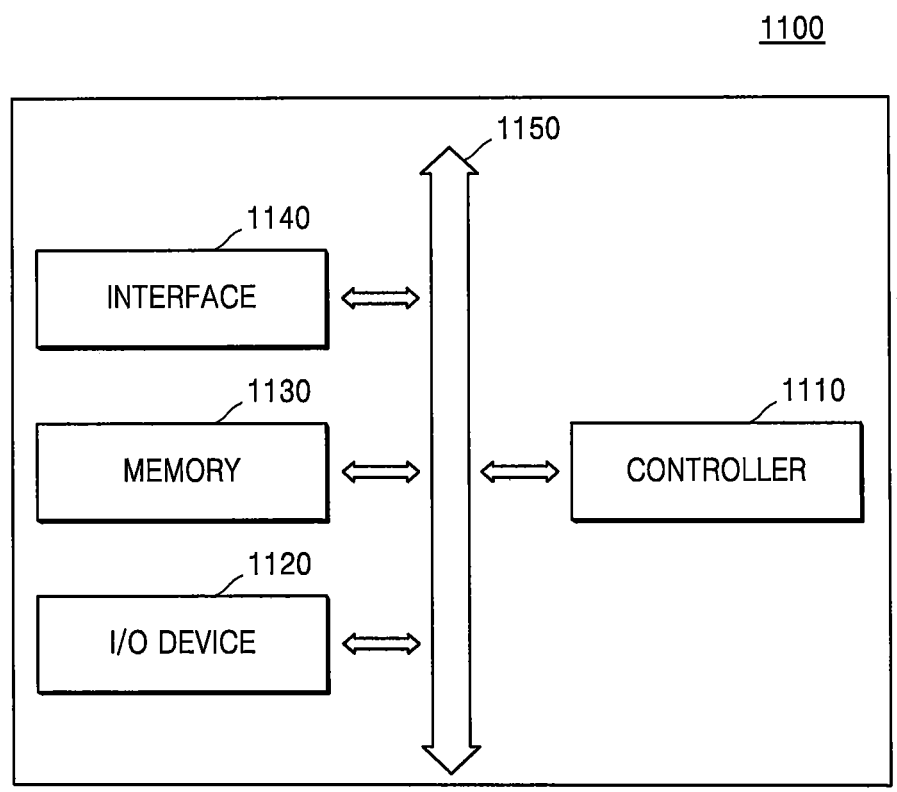
FIG. 17 is a block diagram of a semiconductor system according to some example embodiments.

FIG. 17 is a block diagram of a semiconductor system according to some example embodiments.

Referring to FIG. 17, a system 1100 may include a controller 1110, an input/output (I/O) device 1120, a memory 1130, an interface 1140, and a bus 1150.

The system 1100 may include a mobile system or a system that transmits or receives information. In some embodiments, the mobile system may include a portable computer, a web tablet, a mobile phone, a digital music player, or a memory card.

The controller 1110 controls an execution program in the system 1100 and may include a microprocessor, a digital signal processor, a microcontroller, or a similar device.

The I/O device 1120 may be used for input or output of data of the system 1100. The system 1100 may be connected to and exchange data with an external device, e.g., a personal computer (PC) or a network, using the I/O device 1120. The I/O device 1120 may include, for example, a touch pad, a keyboard, or a display.

The memory 1130 may store data for the operation of the system 1100 or data processed by the controller 1110. The memory 1130 may include, for example, the semiconductor package 100 described with reference to FIGS. 1 through 6 and the semiconductor package 100*a* described with reference to FIGS. 15A and 15B.

The interface 1140 may be a data transmission passage between the system 1100 and an external device. The controller 1110, the I/O device 1120, the memory 1130, and the interface 1140 may communicate with one another through the bus 1150.

While the inventive concepts have been particularly shown and described with reference to example embodiments thereof, it will be understood that various changes in form and details may be made therein without departing from the scope of the following claims.

What is claimed is:

1. A semiconductor package comprising:
   a semiconductor chip including a chip pad;
   an external bump pad electrically connected to the chip pad of the semiconductor chip and including a trench portion extending from a perimeter surface of the external bump pad toward a center of the external bump pad; and
   an external connector on the external bump pad, the external connector including a portion within the trench portion of the external bump pad, the external connector electrically connected to the external bump pad.

2. The semiconductor package of claim 1, wherein the external connector covers the perimeter surface of the external bump pad.

3. The semiconductor package of claim 1, wherein the trench portion is a first trench portion of a plurality of trench portions, and wherein the plurality of trench portions are spaced apart from each other by a uniform distance along a perimeter of the external bump pad.

4. The semiconductor package of claim 3, wherein a distance between adjacent trench portions along the perimeter of the external bump pad is about one to two times a width of the first trench portion.

5. The semiconductor package of claim 1, wherein the external connector covers a portion of the perimeter surface of the external bump pad adjacent to the trench portion, and wherein another portion of the perimeter surface of the external bump pad is free from coverage of the external connector.

6. The semiconductor package of claim 1, further comprising an insulating layer on the semiconductor chip,
   wherein the external bump pad is on a top surface of the insulating layer, and wherein the external connector contacts the top surface of the insulating layer through the trench portion.

7. The semiconductor package of claim 6, further comprising a redistribution pattern in the insulating layer, wherein the redistribution pattern extends between the chip pad of the semiconductor chip and the external bump pad.

8. The semiconductor package of claim 1, wherein a width of the trench portion is between about 5 μm to about 10 μm.

9. The semiconductor package of claim 1, further comprising a cover metal layer between the external bump pad and the external connector, wherein the cover metal layer covers the external bump pad.

10. The semiconductor package of claim 1, wherein, in a plan view, the trench portion extends with a uniform width from the perimeter surface of the external bump pad toward the center of the external bump pad.

11. The semiconductor package of claim 1, wherein, in a plan view, the trench portion narrows from the perimeter surface of the external bump pad toward the center of the external bump pad.

12. A semiconductor package comprising:
    a semiconductor chip including a chip pad;
    an insulating layer on the semiconductor chip;
    a redistribution pattern connected to the chip pad of the semiconductor chip and in the insulating layer;
    an external bump pad connected to the redistribution pattern through an opening of the insulating layer and including a plurality of trench portions spaced apart from each other along an edge of the external bump pad, each of the plurality of trench portions defined by side surfaces that extend from a perimeter surface of the external bump pad toward a center of the external bump pad; and an external connector including a portion contacting the insulating layer through the plurality of trench portions, the external connector covering a perimeter surface of the external bump pad, the external connector electrically connected to the external bump pad.

13. The semiconductor package of claim 12, wherein the plurality of trench portions are symmetrically arranged with respect to a center of the external bump pad.

14. The semiconductor package of claim 12, wherein the plurality of trench portions include a plurality of first trench portions having a first width and a plurality of second trench portions having a second width that is different from the first width, and
wherein the first trench portions and the second trench portions alternate along the edge of the external bump pad.

15. The semiconductor package of claim 12, wherein a width of the plurality of trench portions is about 5 μm to about 10 μm, and
wherein a distance between adjacent trench portions along the edge of the external bump pad is about one to two times the width of a first trench portion of the plurality of trench portions.

16. A semiconductor module comprising:
a module substrate; and
a semiconductor package on the module substrate,
wherein the semiconductor package includes:
a semiconductor chip including a chip pad;
an external bump pad electrically connected to the chip pad of the semiconductor chip and including a plurality of trench portions extending from a perimeter surface of the external bump pad toward a center of the external bump pad; and
an external connector between the external bump pad and the module substrate and within the plurality of trench portions of the external bump pad, the external connector electrically connected to the external bump pad.

17. The semiconductor module of claim 16, wherein the plurality of trench portions are spaced apart from each other by a first distance along an edge of the external bump pad,
wherein each of the plurality of trench portions has a first width, and
wherein the first distance is about one to two times the first width.

18. The semiconductor module of claim 16, wherein the semiconductor package further includes:
an insulating layer on the semiconductor chip; and
a redistribution pattern in the insulating layer, the redistribution pattern extending between the chip pad of the semiconductor chip and the external bump pad,
wherein the external connector is in contact with the insulating layer through the plurality of trench portions.

19. The semiconductor module of claim 16, wherein the external connector covers the perimeter surface of the external bump pad.

20. The semiconductor module of claim 16, wherein the external bump pad includes inner walls within the plurality of trench portions, and wherein the external connector is in contact with the inner walls of the external bump pad.

* * * * *